(12) United States Patent
Shi et al.

(10) Patent No.: US 12,733,402 B2
(45) Date of Patent: Sep. 8, 2026

(54) PREPARATION METHOD FOR SEMICONDUCTOR MATERIAL LEG ARRAY AND BATCH PREPARATION METHOD FOR INTERFACE LAYER OF SEMICONDUCTOR MATERIAL LEG ARRAY

(71) Applicant: CASBOSON TECHNOLOGY (LIYANG) CO., LTD., Liyang (CN)

(72) Inventors: Xun Shi, Shanghai (CN); Ming Gu, Shanghai (CN); Pengfei Qiu, Shanghai (CN); Lidong Chen, Shanghai (CN)

(73) Assignee: CASBOSON TECHNOLOGY (LIYANG) CO., LTD, Liyang (CN)

( * ) Notice: Subject to any disclaimer, the term of this patent is extended or adjusted under 35 U.S.C. 154(b) by 284 days.

(21) Appl. No.: 18/686,578

(22) PCT Filed: Jan. 10, 2023

(86) PCT No.: PCT/CN2023/071690
§ 371 (c)(1),
(2) Date: Feb. 26, 2024

(87) PCT Pub. No.: WO2023/143076
PCT Pub. Date: Aug. 3, 2023

(65) Prior Publication Data

US 2024/0357934 A1 Oct. 24, 2024

(30) Foreign Application Priority Data

Jan. 28, 2022 (CN) ......................... 202210106772.8
Jan. 28, 2022 (CN) ......................... 202210107212.4

(51) Int. Cl.
*H10N 10/01* (2023.01)
*H10N 10/17* (2023.01)

(52) U.S. Cl.
CPC ............. *H10N 10/01* (2023.02); *H10N 10/17* (2023.02)

(58) Field of Classification Search
CPC .............................. H10N 10/01; H10N 10/17
See application file for complete search history.

(56) References Cited

U.S. PATENT DOCUMENTS

2024/0357934 A1* 10/2024 Shi ......................... H10N 10/01

FOREIGN PATENT DOCUMENTS

| | | | |
|---|---|---|---|
| CN | 102637817 | A | 8/2012 |
| CN | 103413888 | A | 11/2013 |
| CN | 112602204 | A | 4/2021 |
| JP | 2002158379 | A | 5/2002 |

* cited by examiner

*Primary Examiner* — Jack S Chen
(74) *Attorney, Agent, or Firm* — Alleman Hall LLP

(57) ABSTRACT

The present invention relates to a preparation method for a semiconductor material leg array and a batch preparation method for an interface layer of a semiconductor material leg array. The preparation method for a semiconductor material leg array comprises: placing a semiconductor block material on a surface of an extrusion mold, placing the semiconductor block material and the extrusion mold in a pressure-resistant sleeve, subjecting the semiconductor block material to plastic deformation by extrusion and filling holes that are arranged in an array on the surface of the extrusion mold, and demolding to obtain a semiconductor material leg array.

10 Claims, 11 Drawing Sheets

PREPARATION METHOD FOR SEMICONDUCTOR MATERIAL LEG ARRAY AND BATCH PREPARATION METHOD FOR INTERFACE LAYER OF SEMICONDUCTOR MATERIAL LEG ARRAY

TECHNICAL FIELD

The present invention relates to a preparation method for a semiconductor material leg array and a batch preparation method for an interface layer of a semiconductor material leg array, which belong to the technical field of semiconductor materials and devices.

BACKGROUND

Small-sized semiconductor devices have broad application prospects in many fields, such as precise temperature control of micro thermoelectric devices through active cooling in micro-zones and self-power supply of wearable devices. However, with the miniaturization of semiconductor devices, the preparation of their core functional components, i.e., high-density and highly integrated n-type and p-type semiconductor material legs and arrays thereof, faces many difficulties. On the one hand, with the miniaturization of devices, the sizes of semiconductor material legs have significantly decreased, making their efficient preparation a major challenge. Conventionally, semiconductor material legs are obtained by cutting semiconductor material blocks. When the size of material legs is reduced to sub-millimeter scale, the cutting yield significantly decreases, while cutting workload and cutting loss greatly increase, resulting in a sharp increase in preparation difficulty and cost. For brittle thermoelectric semiconductor materials, when the size of material legs is less than 0.3 mm, a cutting process is basically infeasible. On the other hand, along with the miniaturization of devices, it is difficult to efficiently carry out the arrangement of material leg array using conventional processes. Taking a micro-thermoelectric device as an example, at present, it is widely used to pick up a single n-type and p-type thermoelectric material leg obtained from the cutting process one by one and transfer to a preset mold for array arrangement. When the size of thermoelectric legs is reduced from a conventional few millimeters to less than 0.3 mm or even less than 0.1 mm, using conventional methods makes it extremely difficult and costly to pick up and transfer hundreds or thousands of thermoelectric legs. Moreover, as the distance between adjacent thermoelectric legs in an array significantly decreases, the inherent gap between the thermoelectric legs and preset mold will significantly affect the accuracy of array arrangement, making it difficult to effectively control the quality of devices.

Furthermore, there are many shortcomings in the prior art during the process of preparing a conventional millimeter-scale or centimeter-scale semiconductor material leg array. On the one hand, semiconductor material legs are prepared based on cutting method in the prior art. Due to the slow cutting speed using a single machine, the production capability is thus limited, and therefore in large-scale production it is necessary to purchase a large number of cutting machines and equip corresponding operators, leading to high equipment and labor costs. In addition, the cutting process also causes considerable material loss and environmental pollution. On the other hand, the existing technology mainly relies on positioning templates, and depends on manually picking up and transferring semiconductor material legs one by one to achieve an array layout, therefore it is difficult to greatly increase the production capacity and effectively control the product quality.

It can be seen that based on the prior art, the preparation of semiconductor material leg array is an inefficient, pollutive and labor-intensive process. There are many defects in the existing technology when preparing a semiconductor material leg array of conventional size, and it is even more difficult to prepare a micro-sized semiconductor material leg array. Therefore, developing a novel preparation method for a semiconductor material leg array to realize a high-quality, low-cost, and large-scale preparation thereof, is of great value for promoting the development of semiconductor devices of conventional size and facilitating the development of devices toward small (micro) scale.

In addition, in semiconductor devices, n-type and p-type semiconductor materials as functional units need to be accessed into circuits in a certain way, so as to ensure a normal operation of the devices. For example, the core functional units of thermoelectric device are thermoelectric legs, which usually are columnar n-type or p-type semiconductor materials. The n-type and p-type thermoelectric legs are arranged in a staggered manner and connected to the metal conducting layers (diversion layers) in upper and lower circuit substrates, forming an electrical series connection and a thermal parallel connection as a whole. Welding is usually adopted to connect semiconductor material legs with the electric circuit. In order to achieve a required interfacial bonding strength and contact performance, it is necessary for the semiconductor material legs to be metallized, that is, prepare an interface layer on the upper and lower surface of the legs, and then connect the interface layer and the circuit by soldering. It can be seen that the preparation of the interface layer of a semiconductor material leg is an important step in the preparation process of devices.

TECHNICAL PROBLEM

Traditionally, the preparation of semiconductor material legs is usually based on a cutting process, and the arrangement of material leg array is realized by a pick-and-transfer process. A thermoelectric device is taken as an example to illustrate the negative influence of the aforementioned process on the preparation of an interface layer of semiconductor material legs. In the field of thermoelectric devices, the commonly used material legs have a dimension ranging from submillimeter-scale to centimeter-scale. There are two main methods to prepare the interface layer of material legs. One is to deposit an interface layer on the whole material block and then cut the material block to obtain material legs with an interface layer. The other is to cut a material block to obtain semiconductor material legs and then deposit an interface layer in batches. The former can cause damage and contamination to the interface layer during cutting, while the latter needs to fix the material legs using a fixture, which is not suitable for batch preparation. Moreover, it is difficult to avoid metallization on the side surface of the material legs when depositing the interface layer. In recent years, micro-thermoelectric devices have become a research hotspot because of their broad application prospect in the fields of accurate temperature control in micro-zones and self-power supply of wearable devices. With a decrease in the size of material legs, damage to an interface layer caused by cutting process becomes more pronounced. Moreover, the number of material legs in micro thermoelectric devices often ranges from hundreds to thousands, and the size of material legs is in the micrometer scale. Considering the difficulty of operation and cost, conventional processes are not suitable for batch preparation of the interface layer of material legs.

TECHNICAL SOLUTION

In view of the aforementioned problems, the present invention provides a preparation method for a semiconductor material leg array and a batch preparation method for an interface layer of a semiconductor material leg array.

In a first aspect, the present invention provides a preparation method for a semiconductor material leg array, comprising: placing a semiconductor block material on a surface of an extrusion mold, placing the semiconductor block material and the extrusion mold into a pressure-resistant sleeve, subjecting the semiconductor block material to plastic deformation by extrusion and filling holes that are arranged in an array on the surface of the extrusion mold, and demolding to obtain the semiconductor material leg array.

Preferably, the extrusion mold comprises a hard substrate and holes distributed in the hard substrate, wherein the hard substrate is a metal substrate (e.g., a steel substrate) or a ceramic substrate.

Preferably, a projection of the holes on a plane parallel to the surface of the hard substrate has a circular, rectangular, triangular, trapezoidal, or fan-shaped shape, and a projection of the holes in a direction perpendicular to the surface of the hard substrate has a rectangular or trapezoidal shape.

Preferably, when the projection of the holes in the direction perpendicular to the surface of the hard substrate has the trapezoidal shape, the bottom angle of a trapezoid is greater than or equal to 90 degrees and less than or equal to 135 degrees, preferably 92 degrees to 100 degrees. The meaning of the above range is that on the one hand, corresponding thermoelectric legs are slightly tapered, which facilitates demolding; and on the other hand, the taper of the thermoelectric legs is not large, so the difference in the size of thermoelectric legs at different positions along the height direction of the thermoelectric legs is small, avoiding a complex structure and performance design of the thermoelectric devices.

Preferably, the projection of the holes on the plane parallel to the surface of the hard substrate has a size of 1 μm to 20 mm, preferably 1 μm to 3,000 μm, and more preferably 30 μm to 500 μm.

Preferably, a minimum distance between centers of adjacent holes is 3 μm to 20 mm, preferably 50 μm to 800 μm.

Preferably, the holes have a depth of 1 μm to 50 mm, preferably 10 μm to 3 mm.

Preferably, a relative deviation between diameters of the semiconductor block material and the extrusion mold and an inner diameter of the pressure-resistant sleeve is less than or equal to 5%, and preferably, an absolute deviation between the diameters of the semiconductor block material and the extrusion mold and the inner diameter of the pressure-resistant sleeve is less than or equal to 0.2 mm. During extrusion, a plastic deformation of the material occurs within the pressure-resistant sleeve. The diameters of the block material and the extrusion mold are equivalent to the inner diameter of the pressure-resistant sleeve (the relative deviation is less than or equal to 5%, and the absolute deviation is less than or equal to 0.2 mm), ensuring that the deformation of the block material mainly occurs in a pressure direction during extrusion.

In the present invention, based on the plasticity of the semiconductor block material, semiconductor material legs and an array thereof are integrally formed through the extrusion process, thus realizing a high-quality, low-cost, and large-scale preparation of the semiconductor material leg array.

Preferably, the semiconductor block material is an intrinsically plastic semiconductor material, a plastic composite material prepared from an intrinsically plastic semiconductor material and an intrinsically non-plastic material, or a muddy mixture prepared based on an intrinsically non-plastic semiconductor material. Furthermore, preferably, the composition of the semiconductor block material is selected from a Ag-based semiconductor material ($Ag_2S_xM_{1-x}$, wherein the element M is Se or Te, and $0 \le x \le 1$), a Cu-based semiconductor material ($Cu_{2-y}Ag_ySe_{1-z}M_z$, wherein $0 \le y \le 1$, $0 \le z \le 1$, and the element M is S or Te), a Bi—Te-based semiconductor material, and a muddy mixture with a Bi—Te-based semiconductor material as a main component.

Preferably, the temperature of extrusion is 5° C. to 500° C. (preferably 30° C. to 250° C.), and is equal to or higher than the softening temperature of the semiconductor block material; the pressure of extrusion is 1 MPa to 10 GPa, preferably 100 MPa to 1 GPa; the pressure-holding time of extrusion is 1 to 100 minutes, preferably 10 to 40 minutes; and the temperature of demolding is higher than the softening temperature of the semiconductor block material, preferably the temperature of demolding is 10° C. to 170° C. Wherein, the semiconductor block material is subjected to an extrusion treatment, and the temperature of the extrusion treatment is continuously increased from room temperature until the semiconductor block material is plastically deformed but does not rupture. This temperature is defined as a softening temperature of the semiconductor material. Appropriate extrusion temperature and pressure are set as needed, so as to ensure that the semiconductor material is extruded to an appropriate position while reducing costs (energy consumption and mold loss).

In a second aspect, the present invention provides a semiconductor material leg array prepared according to the aforementioned preparation method, comprising: semiconductor material legs and an array integrally formed with the semiconductor material legs. The size, arrangement, and pattern design of the semiconductor material leg array are in one-to-one correspondence to holes in the extrusion mold.

In a third aspect, the present invention provides a batch preparation method for an interface layer of a semiconductor material leg array, comprising:

(1) selecting an organic binder as an inlay material and pouring the inlay material into the semiconductor material leg array prepared by the above extrusion method to achieve an integral inlay of the organic binder, and after the inlay material is solidified, subjecting an end surface of the semiconductor material leg array to be flattened by physical treatment and/or chemical treatment, to obtain a semiconductor material leg array containing the inlay material;

(2) depositing the interface layer on the surface of the semiconductor material leg array containing the inlay material, and then removing the inlay material and the interface layer attached to the surface of the inlay material, thereby achieving the batch preparation of the interface layer of the semiconductor material leg array.

For semiconductor materials with a certain plasticity, the inventors developed a technique for preparing semiconductor material legs and an array thereof though an extrusion molding process (extrusion method). Specifically, n-type and p-type materials can be respectively extruded using a mold with a hole array, and after demolding, n-type and p-type semiconductor material leg array connected with the substrate material can be obtained. Compared with the existing cutting process, the difficulty and cost of preparing semiconductor material legs and an array thereof using extrusion molding process can be greatly reduced. Moreover, due to an integral formation of material legs and an array thereof, there is no need to perform subsequently complex transfer and arrangement of the material legs. This process can not only be adopted to prepare existing conventional seized semiconductor legs and an array thereof, but also is particularly suitable for preparing micro semiconductor material legs with a quantity ranging from hundreds to thousands and a size as small as hundreds or even tens of micrometers, and an array thereof. However, in order to realize a batch preparation of an interface layer of the semiconductor material leg array mentioned above, the following problems need to be solved: (1) end surfaces of the semiconductor material legs should meet a certain flatness and morphology requirements to ensure a reliable bonding between the end surfaces and the interface layer; (2) the height consistency of the semiconductor material legs should meet specific requirements to ensure the parallelism of the upper and lower substrates of the device, and to avoid an interfacial pseudo soldering in the integration process of devices; and (3) the interface layer should be limited to the end surfaces of the semiconductor material legs without affecting the sides surfaces of the material legs. Further, the inventors creatively perform an integral inlay on the semiconductor material leg array (the inlay material is an organic binder), end surface treatment, metallization deposition (interface layer deposition) and removal of the inlay material, obtaining semiconductor material legs, end surfaces of which have a required flatness and morphology, and the height of which has a required consistency. The interface layer is merely located on the end surfaces of the material legs without affecting the side surfaces of the material legs. The method is simple to operate, low in cost and suitable for batch preparation of an interface layer of a semiconductor material leg array.

Preferably, the inlay material is selected from one of photoresists (such as SU-8, AZ5214 and UVN), polydimethylsiloxane (PDMS), AB glue, hot and/or cold inlay material (such as phenolic resins from brands Eyepol, Sanling Metallography, and SHHK), and ethyl cyanoacrylate.

Preferably, the physical treatment and/or chemical treatment is at least one of mechanical polishing, chemical grinding, etching, and chemical corrosion.

Preferably, the batch preparation method further comprises: after subjecting an end surface of the semiconductor material leg array to be flattened and before depositing an interface layer, adjusting the morphology of the end surface of the semiconductor material leg array; and preferably, sandblasting, chemical corrosion, or chemical etching are adopted to adjust the morphology of the end surface, so as to increase a roughness of the end surface.

Preferably, the interface layer is selected from at least one of Cu, Ni, Al, In, Te, Sb, Bi, Ge, Pb, Ga, Zn, Cd, Pd, Pt, V, Ta, Hf, Fe, Co, Mn, Ru, Rh, Ir, Mo, Nb, W, Ti, Cr, Zr, Sn, Ag, Au, Pt, TiN, doped $ZrO_2$, $ThO_2$, $LaCrO_2$, $LaNiO_2$, $LaMnO_3$(sr), $CoCrO_4$, $LaCoO_3$(sr), $InO_2/SnO_2$, SiC, and $MoSi_2$; the interface layer has a number of layers of greater than or equal to 1; and the interface layer has a thickness of 10 nm to 20 μm, preferably 1 μm to 10 μm. Preferably, the inlay material and the interface layer attached to the inlay material are removed by at least one of heating, illumination, chemical dissolution, and ultrasonic treatment.

BENEFICIAL EFFECT

The present invention fully utilizes the plasticity of the semiconductor material to prepare thermoelectric legs with the same material by extrusion molding, wherein the size of the semiconductor material legs depends on the size of holes in the extrusion mold. Therefore, it has the following beneficial effects: (a) Compared with various cutting processes, the method described in the present invention breaks through the limitation of mechanical properties of the semiconductor material on the size of material legs. Specifically, the size of material legs can be conveniently reduced to less than 0.3 mm or even less than 0.1 mm. (b) Compared with various deposition processes, the method described in the present invention can cheaply and efficiently prepare semiconductor material legs with a height of micrometers to millimeters, and the adjustment range of the height-to-diameter ratio of the material legs is wide, which is beneficial to optimize the performance of semiconductor devices.

In the present invention, a material leg array with the same semiconductor material is integrally formed by extrusion, instead of sequentially picking up individual material legs, transferring, and arranging them one by one. Therefore, the present invention has the following beneficial effects: a) The forming process of array is greatly simplified, enabling low-cost and large-scale preparation. b) The quality control of array is extremely convenient. Different arrays extruded by the same mold can have exactly the same shape and layout of material legs. c) The present invention can break through the limitation of conventional preparation methods on the positioning accuracy of semiconductor material legs in an array, which is beneficial to further miniaturization of corresponding devices.

Compared with conventional methods, the present invention has less material loss during array preparation process, and as the array size decreases, such advantage becomes more apparent. This is because the material loss in the preparation method of the present invention comes from the need to remove the substrate material connected with the array, which is not related to the height and cross-sectional size of the semiconductor material legs and is easy to control. By contrast, the material loss in the conventional cutting method is related to the height and cross-sectional area of semiconductor material legs. Therefore, with a decrease in the size of material legs, the proportion of material loss will inevitably accelerate.

The extrusion forming technique for a material leg array according to the present invention has a wide application range. In terms of materials, the method can be adopted to prepare corresponding semiconductor material leg arrays from materials that have an intrinsic plasticity under certain conditions or exhibit a plasticity through certain treatments. In terms of size, as long as an extrusion mold with a corresponding size can be prepared, the preparation of semiconductor material legs with a size of micro (micron scale) to macro (millimeter scale to centimeter scale) can be realized.

The present invention can effectively reinforce an individual material leg by performing an integral inlay in the semiconductor material leg array, preventing it from being mechanically damaged during subsequent treatment processes (such as grinding and sandblasting).

By selecting a suitable inlay material, the present invention can conveniently remove the inlay material and the interface layer attached to the inlay material after the preparation of the interface layer on the end surfaces of the semiconductor material legs, leaving only the interface layer on the end surfaces of the semiconductor material legs.

The method has a low cost, simple operation, and is suitable for large-scale preparation. The reason is that the method does not need to prepare a mask that is precisely matched with the semiconductor material leg array, and does not involve a photolithography process and related precision equipment.

DETAILED DESCRIPTION OF PREFERRED EMBODIMENTS

Figure 1:
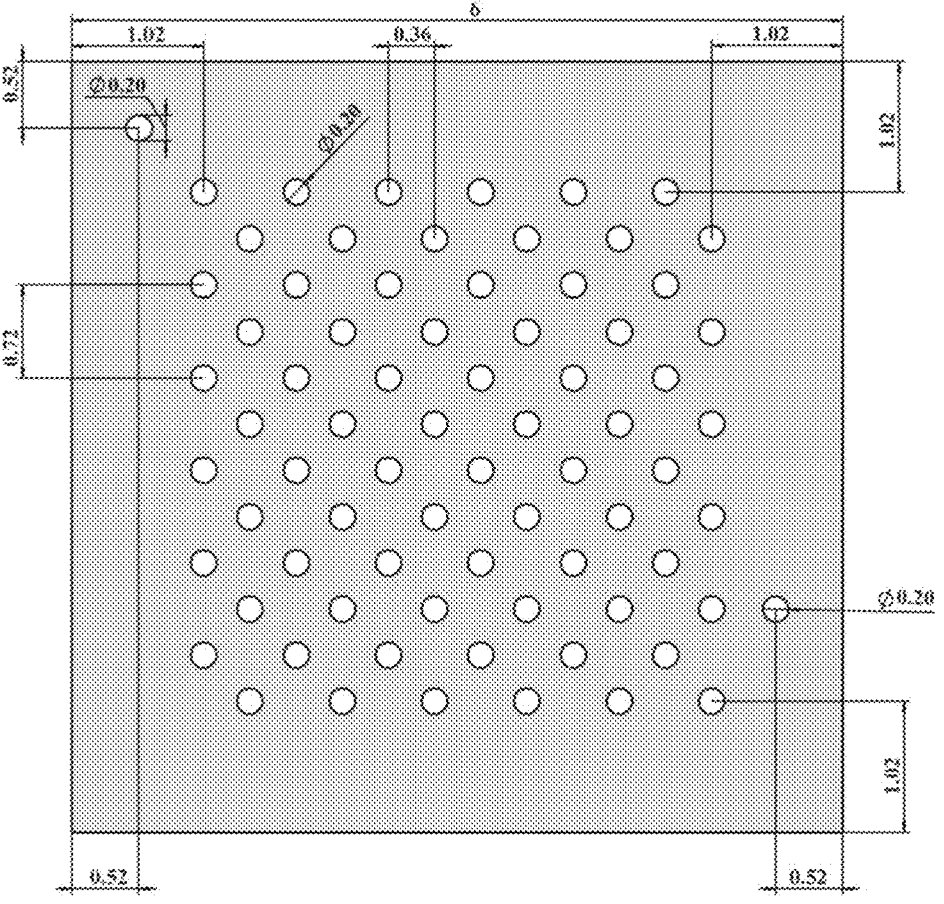
FIG. 1 is a top view schematic diagram of a semiconductor material leg array according to Example 1, which is similar to that of semiconductor material leg arrays according to Examples 2 and 4 to 7.

The present invention will be further illustrated by the following embodiments below, and it should be understood that the following embodiments are only used to illustrate the present invention rather than to limit it.

In the present invention, the preparation process for a semiconductor material leg array comprises: designing and preparing an extrusion mold; integrally forming an n-type (p-type) semiconductor material leg array using the extrusion technology; and demolding. By adopting this method, the semiconductor material legs and an array thereof can be integrally formed, thus realizing a high-quality, low-cost and large-scale preparation of the semiconductor material leg array.

A suitable material is selected for preparing an extrusion mold. The material of the extrusion mold should have a sufficient compressive strength to avoid deformation during repeated heating and cooling process and extrusion process, so that the accuracy of array cannot be affected. According to extrusion process parameters of different semiconductor materials, corresponding mold materials may be steel (such as hard alloy steel, high speed steel, mold steel and stainless steel), metal materials (such as W, Mo, Nb, and Ti), ceramic materials (such as $ZrO_2$, $Al_2O_3$, AlN, and $Si_3N_4$), and other inorganic or organic materials with a required compressive strength and processing property. In a preferred embodiment, the mold material is mold steel. The extrusion mold also includes a press head, etc.

According to parameters of semiconductor material legs and the array thereof, a corresponding hole array is processed in the surface of the mold material. Specifically, according to parameters of a semiconductor material leg array, such as the shape, spacing and arrangement of the material legs, a corresponding hole array is prepared in the surface of mold material by mechanical drilling, laser drilling, etching pore-forming, and so on. A projection of holes of mold in a horizontal direction may have a circular, rectangular, triangular, trapezoidal, fan-shaped, or other irregular shapes; and a projection of holes in a vertical direction (perpendicular direction) may have a rectangular, trapezoidal, or other irregular shapes. In order to facilitate demolding, the inner wall of holes should be as smooth as possible, and the projection of holes on a plane perpendicular to the surface of mold may have a rectangular or trapezoidal shape, with a bottom angle of 90 degrees to 135 degrees, preferably 92 degrees to 100 degrees. The projection of holes on a plane parallel to the surface of a hard substrate may have a size of 1 μm to 20 mm, preferably 1 μm to 3,000 μm, more preferably 20 μm to 500 μm, further preferably 30 μm to 200 μm, and most preferably 50 μm to 200 μm. A minimum distance between centers of adjacent holes may be 3 μm to 20 mm, preferably 50 μm to 800 μm. The depth of the holes may be 1 μm to 50 mm, preferably 10 μm to 3 mm. In a preferred embodiment, a hole array is prepared by laser drilling, with a bottom hole diameter of about 70 μm, a hole depth of about 200 μm, and a bottom angle of trapezoid generated by projection of about 92 degrees. In another preferred embodiment, a hole array is prepared by mechanical drilling, with a bottom hole diameter of about 200 μm, a hole depth of about 400 μm or 500 μm, a bottom angle of trapezoid generated by projection of about 92 degrees, and a minimum distance between centers of adjacent holes of about 707 μm. In another preferred embodiment, a hole array is prepared by mechanical drilling, with a bottom hole diameter of about 150 μm, a hole depth of about 300 μm, and a bottom angle of trapezoid generated by projection of about 100 degrees. In another preferred embodiment, a hole array is prepared by mechanical drilling, with a hole diameter of about 200 μm and a hole depth of about 600 μm, and the projection of holes on a plane perpendicular to the surface of mold has a rectangular shape.

An n-type (p-type) semiconductor block material is placed on the hole array of the extrusion mold. The semiconductor block material and the extrusion mold are placed in a pressure-resistant sleeve with an inner diameter equal to or slightly greater than that of the semiconductor block material and the extrusion mold (a relative dimensional deviation of less than or equal to 5%, and an absolute deviation of less than or equal to 0.2 mm). The material is plastically deformed by extrusion. During the extrusion process, the pressure-resistant sleeve constrains a lateral deformation of the semiconductor material, causing the material to be deformed (mainly) in the pressure direction to fill all the holes. Setting appropriate extrusion temperature, pressure, and pressure-holding time according to specific properties of the semiconductor material, not only ensures that the material can be extruded to an appropriate position (filling the holes), but also reduces the cost (energy consumption and mold loss), while minimizes the impact of extrusion on material properties.

In an alternative embodiment, the semiconductor block material is an Ag-based semiconductor material $Ag_2S_xM_{1-x}$, wherein the element M is Se or Te, $0 \le x \le 1$; the temperature of extrusion may be 5° C. to 170° C., the pressure of extrusion may be 100 MPa to 1 GPa, and the pressure-holding time may be 10 to 60 minutes. In a preferred embodiment, the temperature of extrusion of $Ag_2S$ material is 20° C., the pressure is 1.5 GPa, and the pressure-holding time is 10 minutes. In another preferred embodiment, the temperature of extrusion of $Ag_2S$ material is 80° C., the pressure is 500 MPa, and the pressure-holding time is 40 minutes. In another preferred embodiment, the temperature of extrusion of $Ag_2S$ material is 140° C., the pressure is 200 MPa, and the pressure-holding time is 60 minutes.

In an alternative embodiment, the semiconductor block material is a Cu-based semiconductor material ($Cu_{2-y}Ag_ySe_{1-z}M_z$, wherein $0 \le y \le 1$, $0 \le z \le 1$, and the element M is S or Te); the temperature of extrusion may be 180° C. to 300° C., the pressure of extrusion may be 300 MPa to 1.5 GPa, and the pressure-holding time may be 10 to 60 minutes. In a preferred embodiment, the temperature of extrusion of $Cu_2Se$ material is 250° C., the pressure is 1 GPa, and the pressure-holding time is 40 minutes.

After the extrusion is completed, the semiconductor material legs and the extrusion mold are separated by demolding to obtain a semiconductor material leg array, which is composed of n-type (p-type) semiconductor material legs with the same shape as the holes, and the arrangement of material leg is consistent with the mold hole array. For different semiconductor block materials, it is necessary to set an appropriate temperature of demolding according to the properties of semiconductor block material in this process. Preferably, the demolding temperature should be slightly higher than the softening temperature of the material, usually 10° C. to 50° C. higher than the softening temperature. If the demolding temperature is too low, the thermoelectric legs are prone to brittle fracture under tension during demolding, and the fractured thermoelectric legs remain in the holes of the extrusion mold, resulting in a scrapping of the mold and an incomplete thermoelectric leg array. If the demolding temperature is too high, the material becomes too soft, and therefore can be easily deformed under tension or even fracture. After demolding, a semiconductor material leg array connected with a substrate material is prepared, wherein, the shape and array arrangement of the material legs are completely consistent with the hole array of mold.

In an alternative embodiment, the semiconductor block material is a Ag-based semiconductor material $Ag_2S_xM_{1-x}$, wherein the element M is Se or Te, $0 \le x \le 1$; and after extrusion is completed, the demolding temperature may be 10° C. to 80° C., preferably 20° C. to 40° C.

In an alternative embodiment, the semiconductor block material is a Cu-based semiconductor material ($Cu_{2-y}Ag_ySe_{1-z}M_z$, wherein $0 \le y \le 1$, $0 \le z \le 1$, and the element M is S or Te); and after extrusion is completed, the demolding temperature may be 130° C. to 220° C., preferably 150° C. to 170° C.

By subjecting a proper treatment to the end surfaces of the semiconductor material legs in the array, subsequent implementation of metallization of the end surfaces and integration of semiconductor devices will be facilitated.

In the present invention, the obtained semiconductor material legs are connected with a substrate material, the shape of the semiconductor material legs is the same as that of holes of the mold, and the arrangement of the material leg array is the same as that of the hole array of the mold.

In the present invention, a batch preparation process for an interface layer on the end surfaces of semiconductor material legs comprises the following main steps: an integral inlay of a material leg array, planarization treatment of end surfaces of material legs, morphology treatment of end surfaces, preparation of an interface layer on end surfaces, and removal of an inlay material. The interface layer can be prepared on the end surfaces of the material legs without affecting the side surfaces of the material legs.

In the present invention, a high-quality, low-cost and large-scale preparation of an interface layer of a semiconductor material leg array can be realized, strongly supporting an integrated manufacturing of semiconductor thermoelectric devices. The batch preparation process for an interface layer on the end surfaces of semiconductor material legs will be illustrated below.

A semiconductor material leg array is prepared by extrusion molding. The preparation process for a semiconductor material leg array comprises the following main steps: designing and preparing an extrusion mold, integrally forming an n-type (p-type) semiconductor material leg array using an extrusion process, and demolding. By adopting this method, semiconductor material legs and an array thereof can be integrally formed, thus realizing a high-quality, low-cost, and large-scale preparation of the semiconductor material leg array.

An inlay material is added between the semiconductor material leg array obtained by extrusion molding, making the array and the inlay material integrated as a whole. By inlay to reinforce the array, the semiconductor material legs can be protected from mechanical damage during subsequent processing. The aforementioned inlay material may be various photoresists (such as SU-8, AZ5214, UVN, etc.), PDMS, AB glue, hot and/or cold inlay materials (such as phenolic resins with brands such as Eyepol, Sanling Metallography, and SHHK, etc.), and organic binders such as cyanoacrylate ethyl ester.

By proper end surface treatment, the height of the material legs can be accurately adjusted, and a required end surface morphology can be obtained, realizing a reliable bonding between the material legs and the interface layer. After the inlay material is solidified, the end surfaces of the semiconductor material legs are properly treated by mechanical polishing, chemical grinding, chemical etching or chemical corrosion to obtain flat end surfaces with a required size and perpendicular to the height direction of the material legs, while achieving a required consistency in the height of all the material legs. Preferably, further treatment such as sandblasting, chemical corrosion or chemical etching can be performed on the flat end surface as needed to obtain a required surface morphology, so as to improve the bonding between the interface layer and the end surfaces.

An interface layer is prepared on the surface of an inlay sample of the semiconductor material leg array subjected to the aforementioned treatment. The preparation methods include physical vapor deposition, screen printing, electroplating, electroless plating, etc. The interface layer may be one or more of Cu, Ni, Al, In, Te, Sb, Bi, Ge, Pb, Ga, Zn, Cd, Pd, Pt, V, Ta, Hf, Fe, Co, Mn, Ru, Rh, Ir, Mo, Nb, W, Ti, Cr, Zr, Sn, Ag, Au, Pt, and other metals, or may be a conductive ceramic, such as TiN, doped $ZrO_2$, $ThO_2$, $LaCrO_2$, $LaNiO_2$, $LaMnO_3$(sr), $CoCrO_4$, $LaCoO_3$(sr), $InO_2/SnO_2$, SiC, or $MoSi_2$. The interface layer may have a single-layer structure or a multi-layer structure. The thickness of the interface layer may be 10 nm to 20 μm, preferably 1 μm to 10 μm.

By means of heating, illumination, chemical dissolution, ultrasonic treatment, or a combination thereof, the inlay material is removed, and at the same time, the interface layer attached to the inlay material is also removed, so as to obtain a semiconductor material leg array. The interface layer is only attached to the end surfaces of the material legs, and the high consistency of the material legs meets requirements. Due to a thin thickness of the interface layer, the interface layer will collapse while removing the inlay material, and the interface layer will be removed together with the inlay material.

In alternative embodiments, different removal methods can be used for different inlay materials. For example, acetone can be used to remove ethyl cyanoacrylate, some AB glues, and cold and hot inlay materials; corresponding developing solutions may be used to remove various types of photoresists; and dichloromethane may be used to remove PDMS.

The semiconductor material leg array with a deposited interface layer may be subsequently bonded to a corresponding circuit through an appropriate process.

Examples will be taken to further illustrate the present invention in detail below. It should also be understood that the following examples are only used to further illustrate the present invention rather than to limit the protection scope of the present invention. All non-essential improvements and adjustments which are made by those skilled in the art according to the above contents of the present invention shall fall within the protection scope of the present invention. The specific technological parameters of the following examples are merely one example in an appropriate range, that is, those skilled in the art can make choices within the appropriate range through the description herein, but the choices are not limited to the specific values of the following examples.

Example 1

Figure 2A:
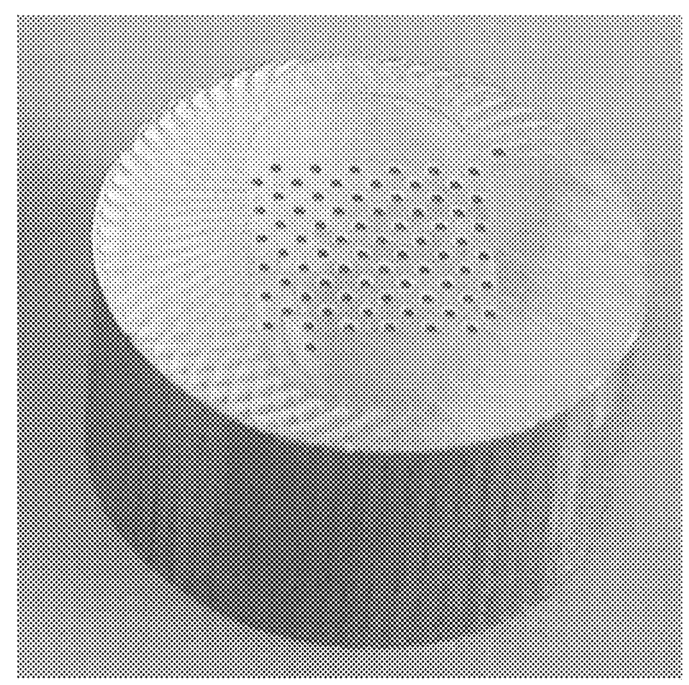
FIGS. 2*a* and 2*b* show extrusion molds used in Examples 1, 4, and 5, respectively. The extrusion molds used in other embodiments have a similar appearance to FIG. 2*a*.
Figure 2B:
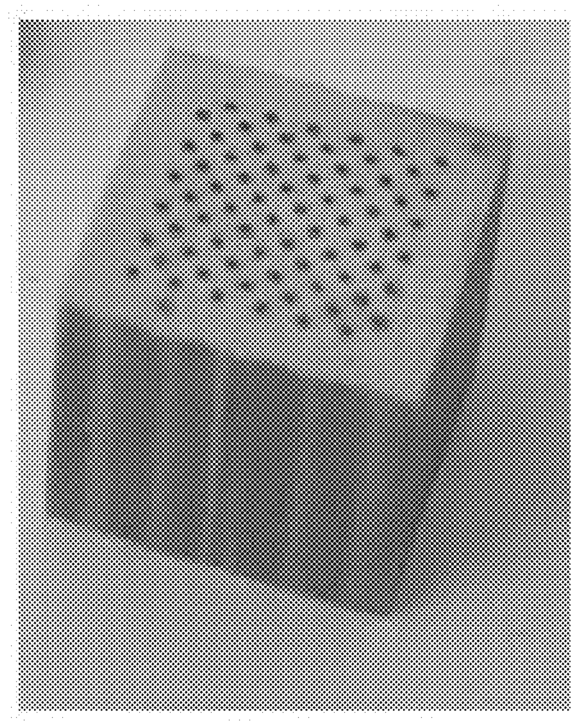
Figure 3:
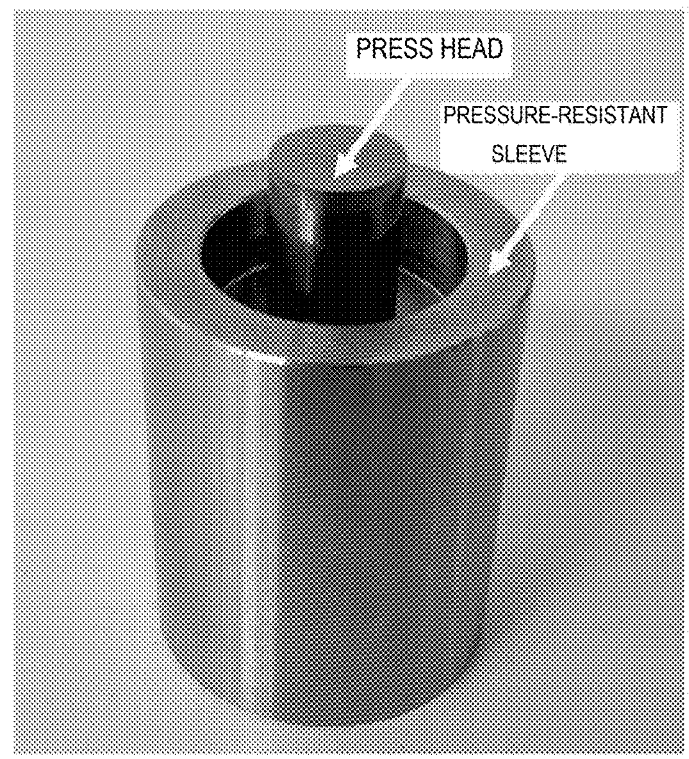
FIG. 3 shows a pressure-resistant sleeve and a press head used in Examples 1 to 4, 6, and 7.

A hole array as shown in FIG. 1 and FIG. 2*a* was prepared on the surface of steel (HRC=60) mold by mechanical drilling technology. The hole array has a bottom hole diameter of approximately 200 μm and a hole depth of approximately 500 μm. The projection of holes on a plane perpendicular to the mold surface has a trapezoidal shape, with a bottom angle of about 92 degrees.

Figure 4A:
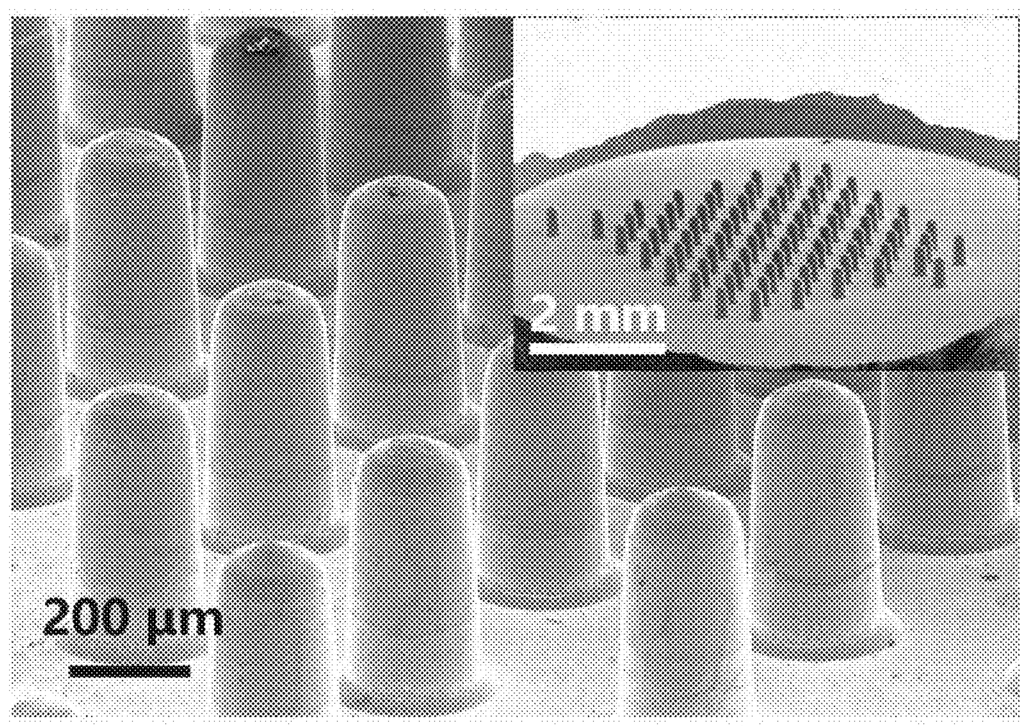
FIGS. 4*a*, 4*b*, and 4*c* show semiconductor material leg arrays obtained by the preparation method of the present invention in Examples 1, 2, and 6, respectively.

An $Ag_2S$ material was machined into a block with a diameter of 9.90 mm and a thickness of 1 mm. The block was placed on the hole array of the extrusion mold, and then the material and the extrusion mold were placed in a pressure-resistant sleeve with an inner diameter of 10 mm in sequence. At room temperature of 20° C., a pressure was subjected, increased to 1.5 GPa under a rising rate of 0.2 GPa/s, kept for 10 minutes and then released. Demolding was performed at 20° C. to obtain an $Ag_2S$ thermoelectric leg array connected with a substrate material, as shown in FIG. 4*a*.

Example 2

A micro-hole array similar to that shown in FIG. 1 was prepared in the surface of steel (HRC=50) mold by mechanical drilling technology. The micro-hole array has a bottom hole diameter of approximately 150 μm and a hole depth of approximately 300 μm. The projection of holes in a plane direction perpendicular to the mold surface has a trapezoidal shape, with a bottom angle of approximately 100 degrees.

Figure 4B:
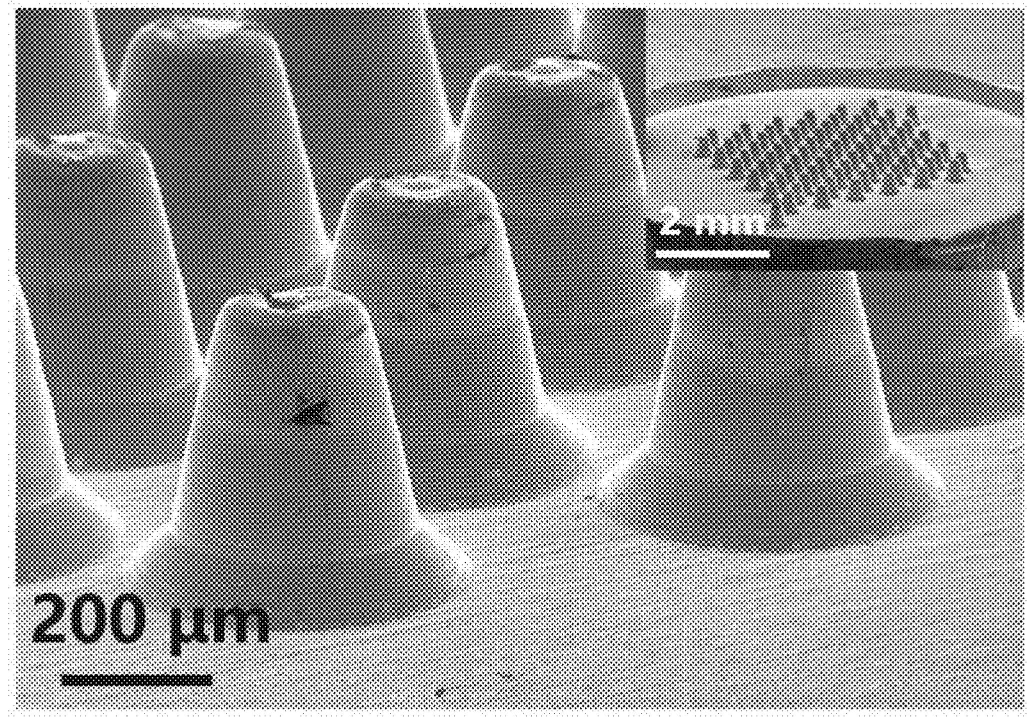

An $Ag_2S$ material was machined into a block with a diameter of 9.90 mm and a thickness of 1 mm. The block was placed on the hole array of the extrusion mold, and then the material and the extrusion mold were placed in a pressure-resistant sleeve with an inner diameter of 10 mm in sequence. The material and the mold were heated to 80° C. at a heating rate of 10° C./min and kept for 5 minutes. Then a pressure was subjected, increased to 500 MPa at a rising rate of 0.2 GPa/s, kept for 40 minutes and released. Demolding was performed at 20° C. to obtain an $Ag_2S$ thermoelectric leg array connected with a substrate material, as shown in FIG. 4*b*.

Example 3 (70 μm)

Figure 5A:
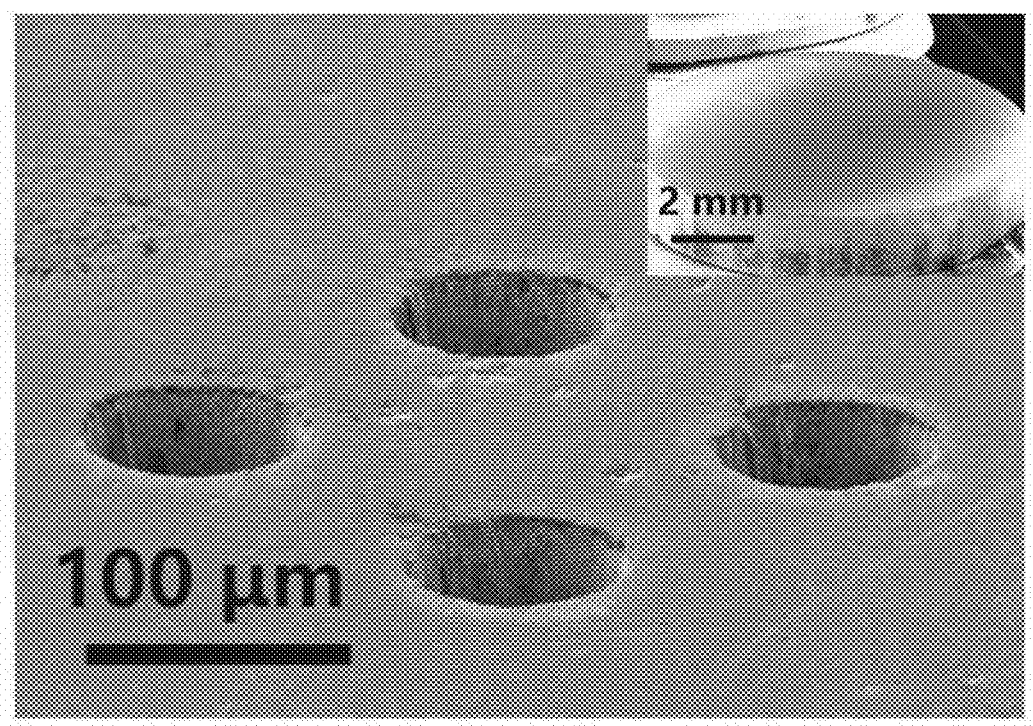
FIGS. 5*a* and 5*b* show an extrusion mold used in Example 3 and a semiconductor material leg array obtained by the preparation method of the present invention, respectively.

A micro-hole array as shown in FIG. 5*a* was prepared on the surface of steel (HRC=50) mold by laser drilling technology. The micro-hole array has a bottom hole diameter of approximately 70 μm and a hole depth of approximately 200 μm. The projection of holes in a plane direction perpendicular to the mold surface has a trapezoidal shape, with a bottom angle of approximately 92 degrees.

Figure 5B:
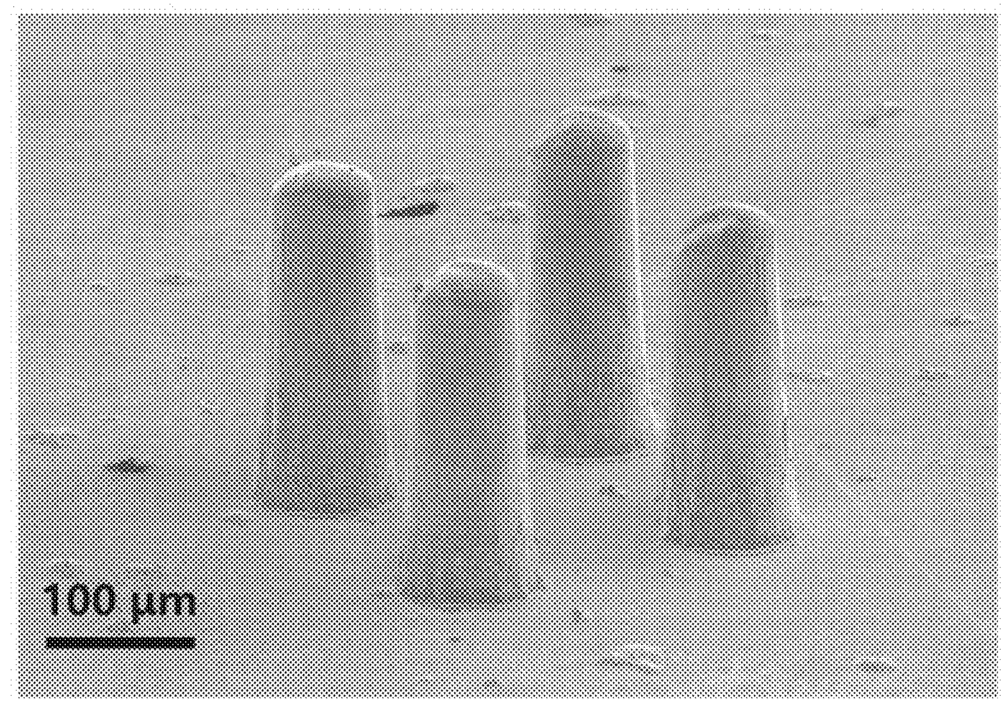

An $Ag_2S$ material was machined into a block with a diameter of 9.9 mm and a thickness of 1 mm. The block was placed on the hole array of the extrusion mold, and then the material and the extrusion mold were placed in a pressure-resistant sleeve with an inner diameter of 10 mm in sequence. The material and the mold were heated from a room temperature of 20° C. to 140° C. at a heating rate of 20° C./min and kept for 10 minutes. A pressure was subjected, increased to 0.2 GPa at a rising rate of 0.1 GPa/s, kept for 60 minutes and then released. Demolding was performed at 20° C. to obtain an $Ag_2S$ thermoelectric leg array connected with a substrate material, as shown in FIG. 5*b*.

Example 4 (Rectangle)

A micro-hole array similar to that shown in FIG. 1 was prepared on the surface of steel (HRC=50) mold by mechanical drilling technology. The micro-hole array has a hole diameter of approximately 220 μm and a hole depth of approximately 600 μm. The projection of holes in a plane direction perpendicular to the mold surface has a rectangular shape.

Figure 6A:
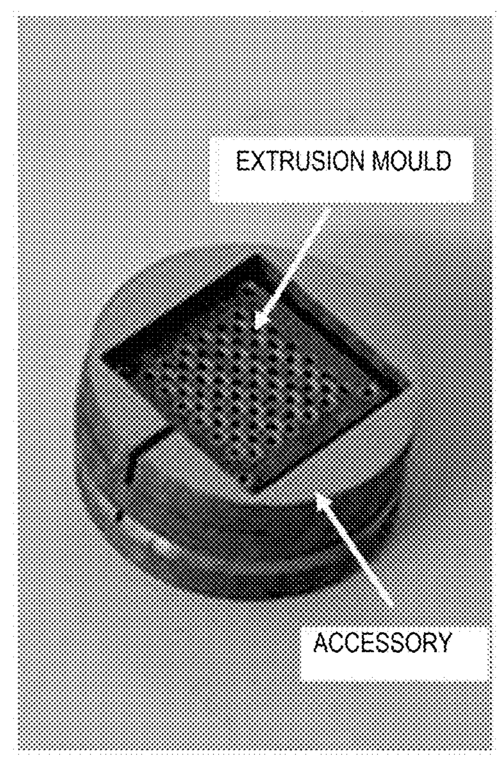
FIGS. 6*a* and 6*b* show an extrusion mold and an accessory thereof (with a shape of an outer circle and an inner square) used in Example 4, as well as a semiconductor material leg array obtained by the preparation method of the present invention, respectively.
Figure 6B:
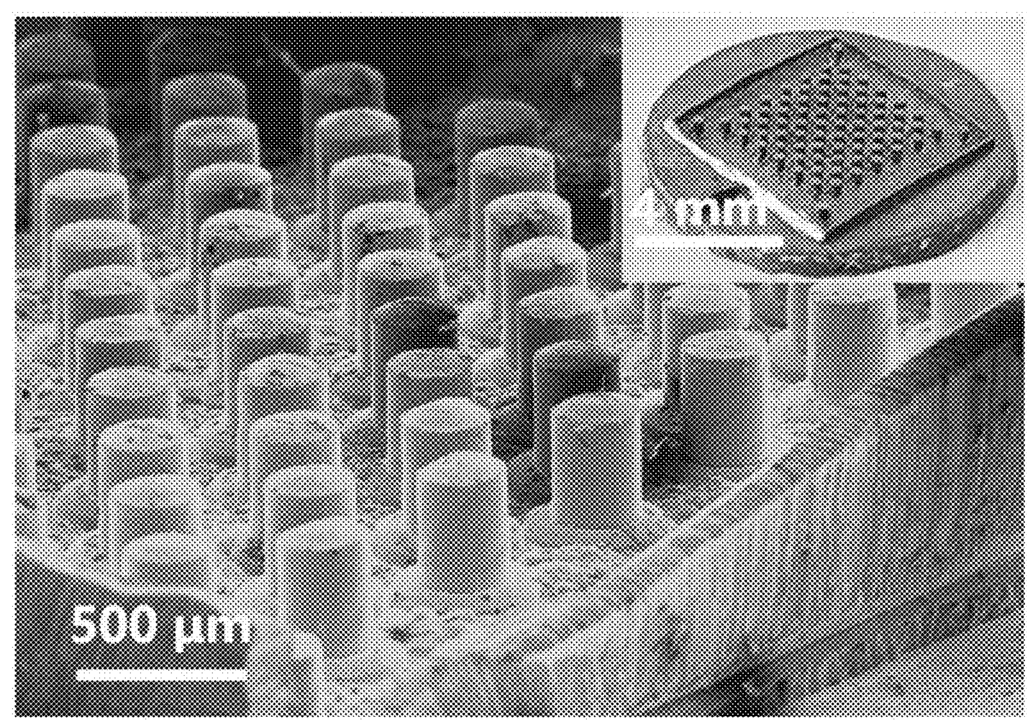

An $Ag_2S$ material was machined into a block with a diameter of 9.9 mm and a thickness of 1 mm. The block was placed on the hole array and surrounding extrusion accessory of the extrusion mold (as shown in FIG. 6*a*), and the material and the extrusion mold were then placed in a pressure-resistant sleeve with an inner diameter of 10 mm in sequence. The material and the mold were heated to 80° C. at a heating rate of 10° C./min and kept for 5 minutes. A pressure was subjected, increased to 500 MPa at a rising rate of 0.2 GPa/s, kept for 40 minutes and then released. Demolding was performed at 20° C. to obtain an $Ag_2S$ thermoelectric leg array connected with a substrate material, as shown in FIG. 6*b*.

Example 5 (No Pressure-Resistant Sleeve, and Deformed Array)

Figure 7A:
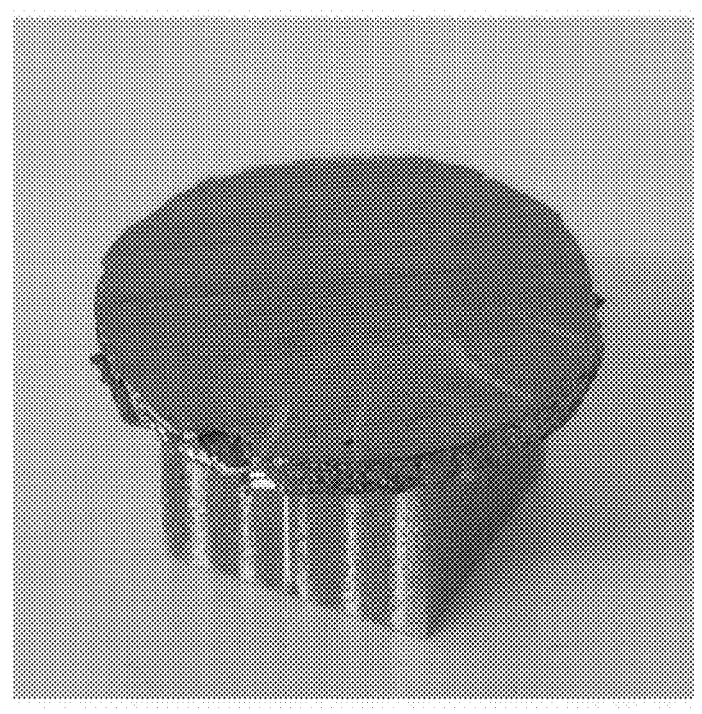
FIGS. 7*a*, 7*b*, and 7*c* show an extrusion mold and a semiconductor block material placed thereon before extrusion, a semiconductor material, and an extrusion mold after extrusion without using a pressure-resistant sleeve, and a semiconductor material leg array obtained after demolding in Example 5, respectively.
Figure 7B:
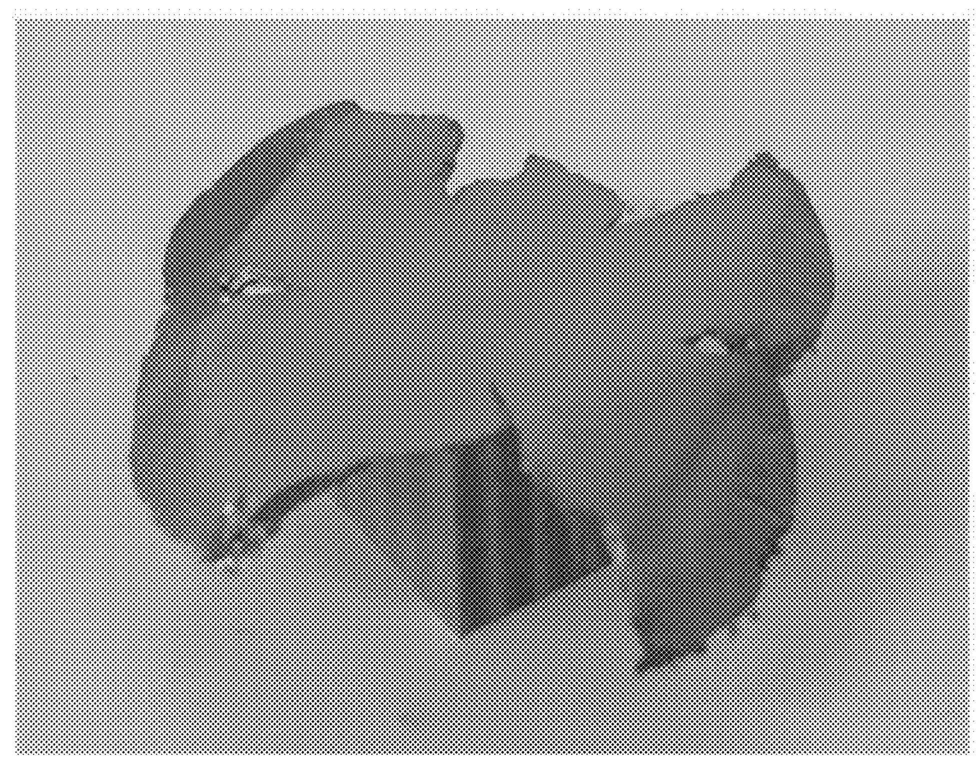
Figure 7C:
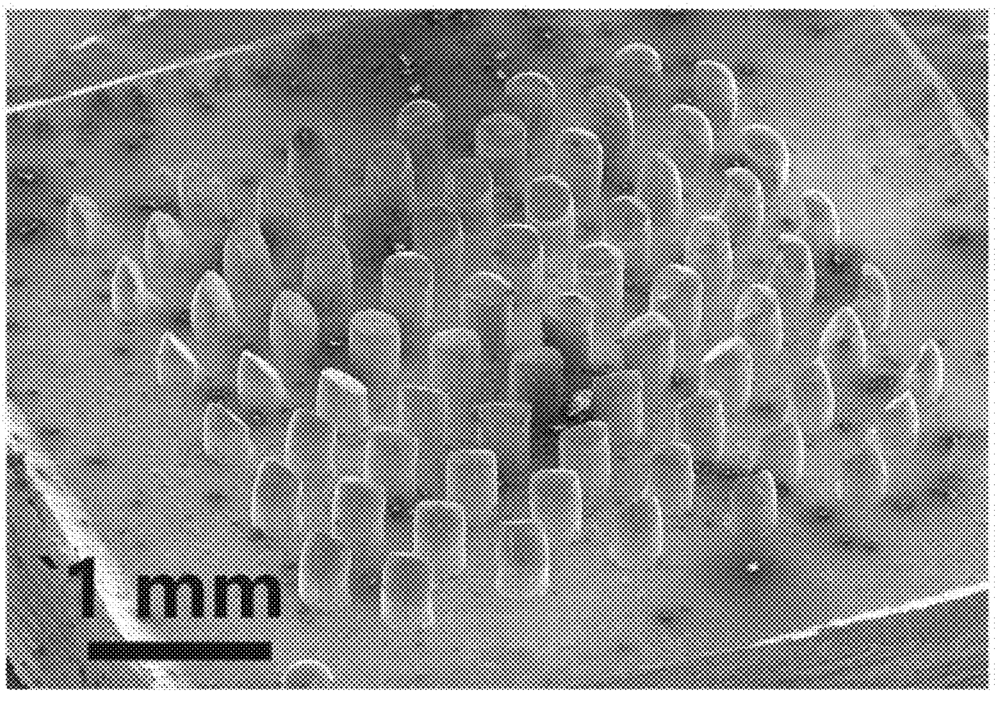

An $Ag_2S$ material was machined into a block with a diameter of 9.9 mm and a thickness of 1 mm. The block was placed on the hole array of the extrusion mold described in Example 4, without a pressure-resistant sleeve, as shown in FIG. 7*a*. The material and the mold were heated to 80° C. at a heating rate of 10° C./min and kept for 5 minutes. Then a pressure was subjected, increased to 500 MPa at a rising rate of 0.2 GPa/s, kept for 40 minutes and then released. The material block had an obvious lateral deformation, as shown in FIG. 7*b*. Demolding was performed at 20° C. to obtain an $Ag_2S$ thermoelectric leg array connected with a substrate material, but the thermoelectric legs in the array were severely deformed, as shown in FIG. 7*c*.

Example 6 ($Cu_2Se$)

Figure 4C:
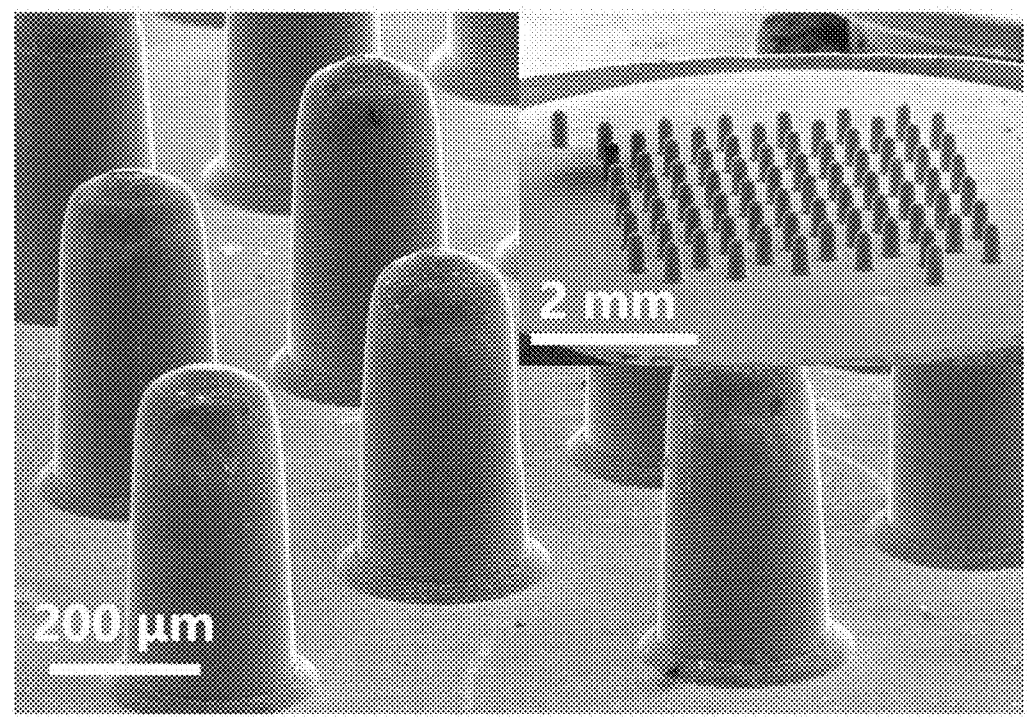

A $Cu_2Se$ material was machined into a block with a diameter of 9.9 mm and a thickness of 1 mm. The block was placed on the hole array of the extrusion mold described in Example 1, and the material and the extrusion mold were then placed in a pressure-resistant sleeve with an inner diameter of 10 mm in sequence. A pressure was subjected, increased to 1 GPa under a rising rate of 0.2 GPa/s at 250° C., kept for 40 minutes and then released. Demolding was performed at 160° C. to obtain a $Cu_2S$ thermoelectric leg array connected with a substrate material, as shown in FIG. 4*c*.

Example 7 (Fractured $Cu_2Se$)

Figure 8A:
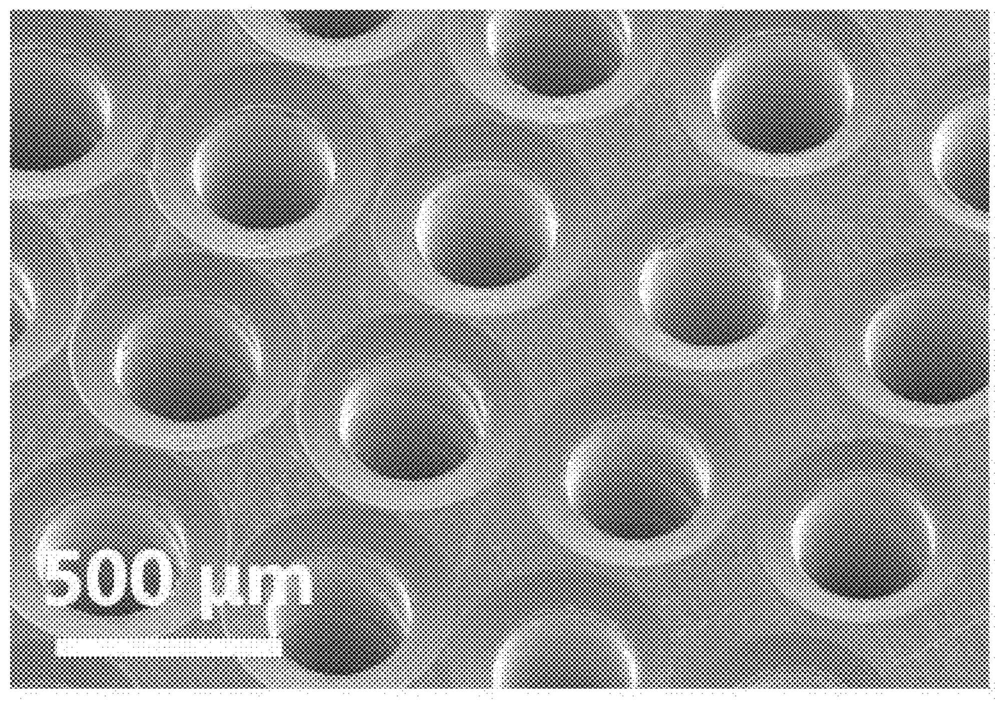
FIGS. 8*a* and 8*b* show a hole array of an extrusion mold before extrusion, and a hole array of an extrusion mold with a large number of semiconductor material legs fracture residues in Example 7, respectively. The fracture is caused by a low temperature of demolding after extrusion.
Figure 8B:
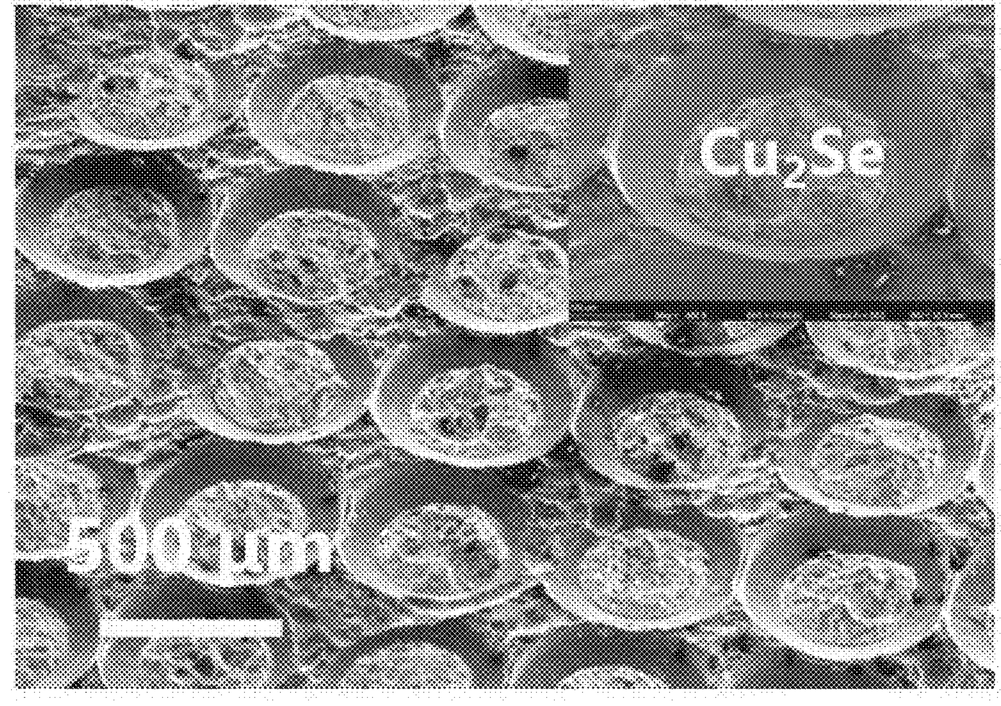

A $Cu_2S$ material was machined into a block with a diameter of 9.9 mm and a thickness of 1 mm. The block was placed on the hole array of the extrusion mold described in Example 1, and the material and the extrusion mold were then placed in a pressure-resistant sleeve with an inner diameter of 10 mm in sequence. A pressure was subjected, increased to 1 GPa under a rising rate of 0.2 GPa/s at 250° C., kept for 40 minutes and then released. Demolding was performed at 120° C. During the demolding process, the roots of the thermoelectric legs fractured, with a large number of residual thermoelectric legs in the holes of the extrusion mold, as shown in FIG. 8*b*. The preparation of array failed, and the extrusion mold was scrapped.

Example 8

Figure 9:
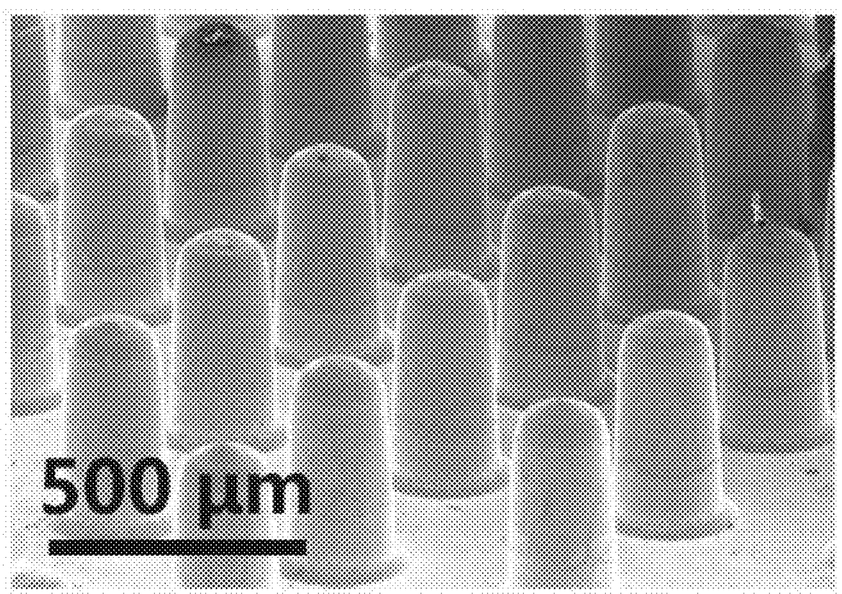
FIG. 9 shows an $Ag_2S$ material leg array obtained by hot extrusion in Example 8.

As shown in FIG. 9, an $Ag_2S$ material leg array was obtained by hot extrusion. The bottom of the material legs is connected with an $Ag_2S$ material substrate, which has a uniform thickness. The preparation process for the $Ag_2S$ material leg array comprises: a required hole array was prepared in the surface of steel (HRC=60) mold by mechanical drilling technology. The hole array has a bottom hole diameter of approximately 200 μm and a hole depth of approximately 500 μm. The projection of holes on a plane perpendicular to the mold surface has a trapezoidal shape, with a bottom angle of approximately 92 degrees. An $Ag_2S$ material was machined into a block with a diameter of 9.9 mm and a thickness of 1 mm. The block was placed on the hole array of the extrusion mold, and the material and the extrusion mold were placed in a pressure-resistant sleeve with an inner diameter of 10 mm in sequence. A pressure was subjected, increased to 1.5 GPa under a rising rate of 0.2 GPa/s at room temperature of 20° C., kept for 10 minutes and then released. Finally, demolding was performed at 20° C.

Figure 10:
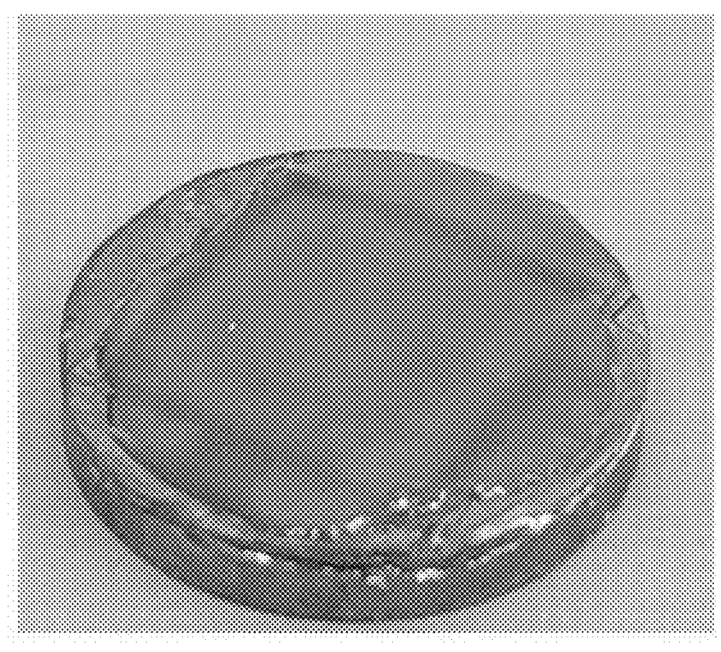
FIG. 10 shows a material leg array sample subjected to integral inlay in Example 8.
Figure 11:
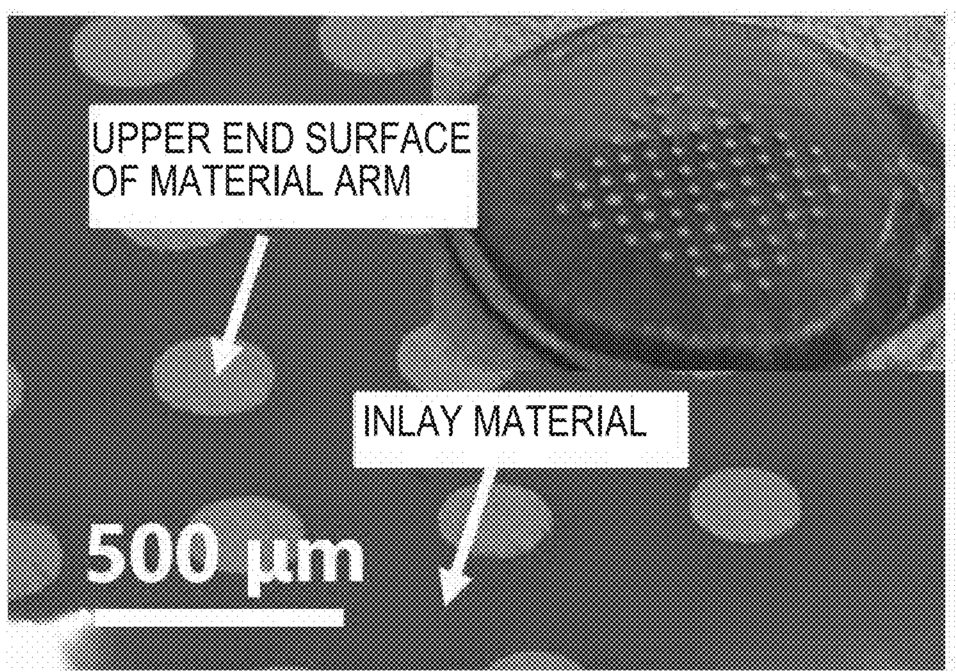
FIG. 11 shows a material leg array sample with flattened end surfaces after integral inlay in Example 8. It can be seen that material legs are buried in the inlay material, only exposing an upper end surface after a planarization treatment.

Ethyl cyanoacrylate was added dropwise into the gap between the semiconductor material legs in the array, and filled the gap between the material legs. The array was placed at normal atmospheric temperature (5° C. to 35° C.) for 12 hours for solidification, as shown in FIG. 10. An inlay sample was fixed on a sample table of a grinder, and the surface of the inlay sample was ground by an alumina grinding wheel until the end surfaces of the material legs were exposed. Grinding was continued downwards to remove uneven areas at the top of the material legs, obtaining an inlay array of material legs with a consistent end surface shape and size. Moreover, the heights of all the material legs also reach a consistency as required, as shown in FIG. 11.

The surface of the aforementioned sample was then sandblasted (using $Al_2O_3$ particles with a particle size of 220 meshes at a sandblasting pressure of 0.05 MPa to 0.2 MPa). The sandblasted surface was ultrasonically cleaned by alcohol and then air dried. After drying, Cu was deposited on the surface by magnetron sputtering (with a sputtering power of 200 W and a sputtering time of 2 hours, under a temperature of 100° C. and an air pressure of 0.5 Pa). Thus, a Cu interface layer with a thickness of about 5 μm was obtained.

Figure 12:
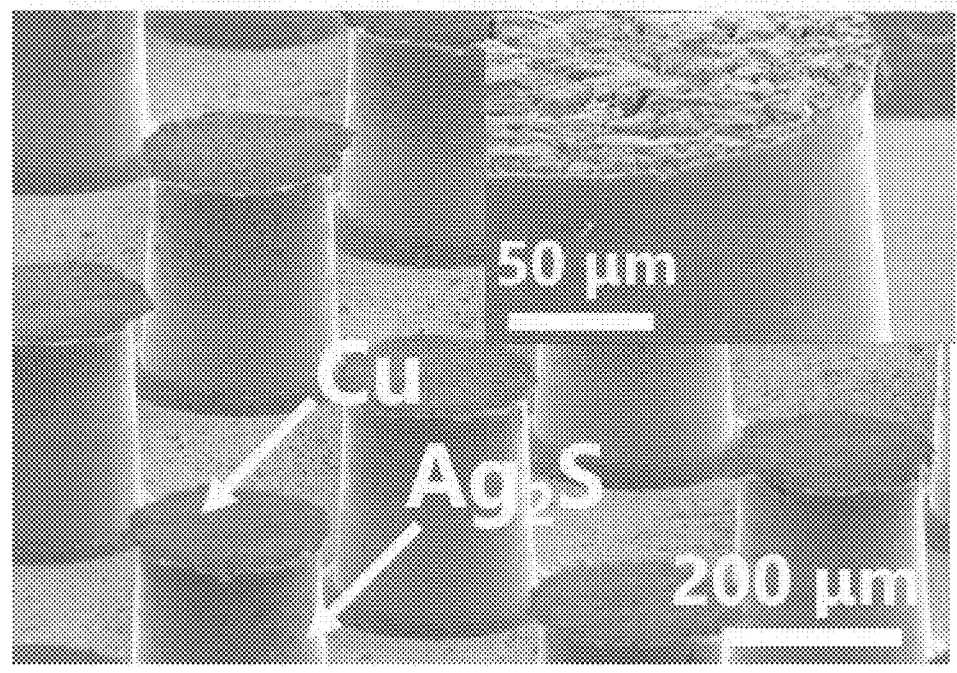
FIG. 12 shows a material leg array after depositing a Cu interface layer and removing an inlay material and the Cu interface layer attached to the inlay material in Example 8. It can be seen that the Cu interface layer only covers the upper end surfaces of the material legs without affecting the side surfaces of the material legs.

The sample sputtered with a Cu layer was immersed into acetone. The inlay material was dissolved ultrasonically, and at the same time, the Cu layer attached to the inlay material was removed. An $Ag_2S$ material leg array, as shown in FIG. 12, was obtained. The height, shape of end surface and size of the material legs may meet requirements, and merely a Cu layers is attached to the end surfaces of the material legs, FIGS. 9 to 12 shows photos of products obtained from each step of preparing a Cu interface layer on the $Ag_2S$ material leg array in Example 8.

Example 9

Figure 13:
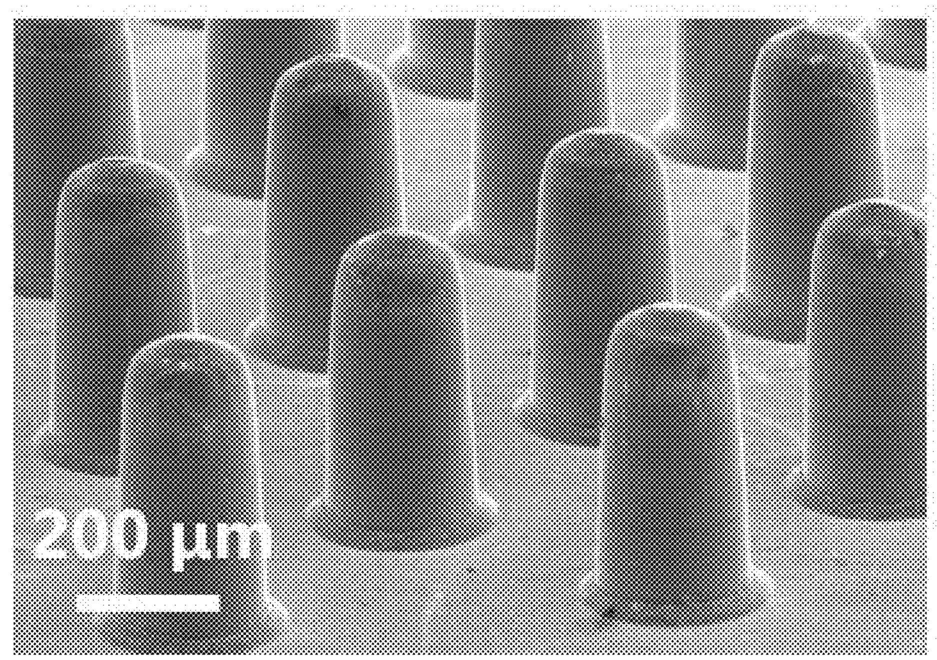
FIG. 13 is a $Cu_2Se$ material leg array obtained by hot extrusion in Example 9.

As shown in FIG. 13, a $Cu_2Se$ material leg array was obtained by hot extrusion. The bottom of the material legs is connected with a $Cu_2Se$ material substrate, which has a uniform thickness. The preparation process for the $Cu_2Se$ material leg array comprises: a required hole array was prepared in the surface of steel (HRC=60) mold by mechanical drilling technology. The hole array has a bottom hole diameter of approximately 200 μm and a hole depth of approximately 500 μm. The projection of holes on a plane perpendicular to the mold surface has a trapezoidal shape, with a bottom angle of approximately 92 degrees. A $Cu_2Se$ material was machined into a block with a diameter of 9.9 mm and a thickness of 1 mm. The block was placed on the hole array of the extrusion mold, and the material and the extrusion mold were placed in a pressure-resistant sleeve with an inner diameter of 10 mm in sequence. A pressure was subjected, increased to 1 GPa under a rising rate of 0.2 GPa/s at 250° C., kept for 40 minutes and then released. Finally, demolding was performed at 160° C.

UVN photoresist was added dropwise into the gap between the semiconductor material legs in the array. The array was placed at 95° C. until the UVN photoresist solidified. Then the photoresist was dropped, and the array was placed at 95° C. again until the UVN photoresist solidified. The above step was repeated until the photoresist could cover the top of the $Cu_2Se$ material legs after solidifying.

The inlay sample was fixed on a sample table of a grinder, and the surface of the inlay sample was ground by an alumina grinding wheel until the end surfaces of the material legs were exposed. Grinding was continued downwards to remove uneven areas at the top of the material legs, obtaining an inlay array of material legs with a consistent shape of end surface and size. Moreover, the heights of all the material legs also reach a consistency as required.

The surface of the aforementioned sample was then sandblasted (using $Al_2O_3$ particles with a particle size of 220 meshes at a sandblasting pressure of 0.05 MPa to 0.2 MPa). The sandblasted surface was ultrasonically cleaned by alcohol and then air dried. After drying, W was deposited on the surface by magnetron sputtering (with a sputtering power of 100 W and a sputtering time of 30 minutes, under a temperature of 100° C. and an air pressure of 0.5 Pa). And Cu was then deposited on the surface by magnetron sputtering (with a sputtering power of 200 W and a sputtering time of 30 minutes, under a temperature of 100° C. and an air pressure of 0.5 Pa).

Figure 14:
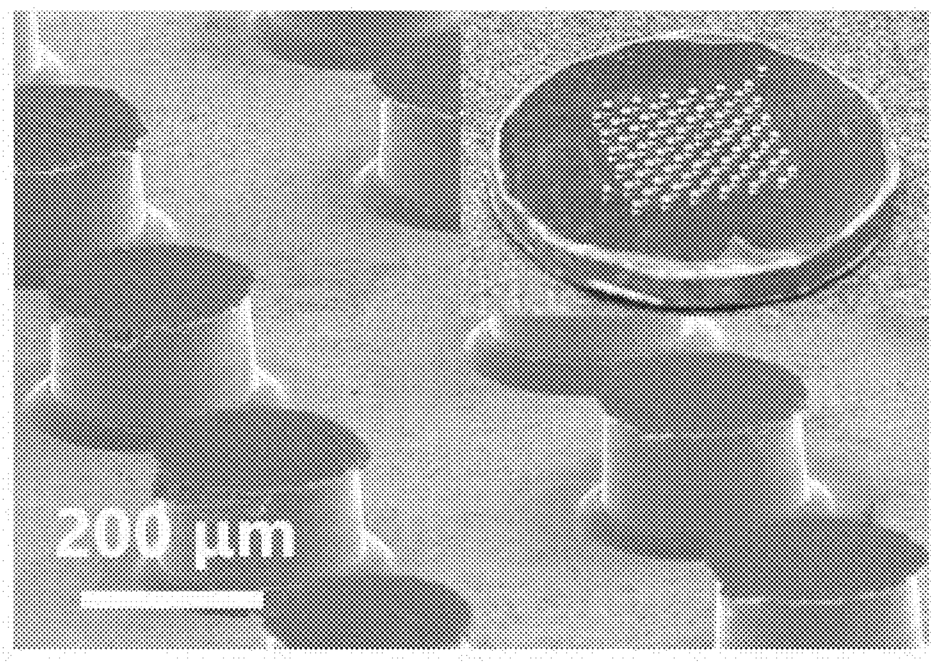
FIG. 14 shows a material leg array sample subjected to planarization treatment of end surfaces, sandblasting, metallization, and removal of the inlay material after an integral inlay of UVN in Example 9. It can be seen that a metal interface layer only covers the upper end surfaces of the material legs without affecting the side surfaces of the material legs.

The sample sputtered with a W/Cu layer was immersed into a UVN developing solution. The solidified photoresist was dissolved ultrasonically, and at the same time, the interface layer attached to the inlay material was removed. A $Cu_2Se$ material leg array, as shown in FIG. 14, is obtained. The height, shape of end surface and size of the material legs may meet requirements and merely a W/Cu layer is attached to the end surfaces of the material legs. FIGS. 13 and 14 shows photos of products obtained from each step of preparing a Cu interface layer on the $Cu_2Se$ material leg array in Example 9.

What is claimed is:

1. A preparation method for a semiconductor material leg array, comprising:

placing a semiconductor block material on a surface of an extrusion mold;

placing the semiconductor block material and the extrusion mold in a pressure-resistant sleeve;

subjecting the semiconductor block material to plastic deformation by extrusion and filling holes that are arranged in an array on the surface of the extrusion mold; and demolding to obtain a semiconductor material leg array;

wherein the temperature of extrusion is 5° C. to 500° C., and is equal to or higher than the softening temperature of the semiconductor block material; the pressure of extrusion is 1 MPa to 10 GPa; and the pressure-holding time of extrusion is 1 to 100 minutes;

wherein the temperature of demolding is 10° C. to 170° C. and higher than the softening temperature of the semiconductor block material.

2. The preparation method according to claim 1, wherein the extrusion mold comprises a hard substrate and holes distributed in the hard substrate, wherein the hard substrate is a metal substrate or a ceramic substrate;

wherein a projection of the holes on a plane parallel to the surface of the hard substrate has a circular, rectangular, triangular, trapezoidal, or fan-shaped shape;

wherein a projection of the holes in a direction perpendicular to the surface of the hard substrate has a rectangular or trapezoidal shape; and when the projection of the holes in the direction perpendicular to the surface of the hard substrate has the trapezoidal shape, the bottom angle of a trapezoid of the trapezoidal shape is greater than or equal to 90 degrees and less than or equal to 135 degrees.

3. The preparation method according to claim 2, wherein the projection of the holes on the plane parallel to the surface of the hard substrate has a size of 1 μm to 20 mm.

4. The preparation method according to claim 1, wherein a minimum distance between centers of adjacent holes is 3 μm to 20 mm.

5. The preparation method according to claim 1, wherein the holes has a depth of 1 μm to 50 mm.

6. The preparation method according to claim 1, wherein a relative deviation between diameters of the semiconductor block material and the extrusion mold and an inner diameter of the pressure-resistant sleeve is less than or equal to 5%; and wherein an absolute deviation between the diameters of the semiconductor block material and the extrusion mold and the inner diameter of the pressure-resistant sleeve is less than or equal to 0.2 mm.

7. The preparation method according to claim 1, wherein the composition of the semiconductor block material is selected from an Ag-based semiconductor material ($Ag_2S_xM_{1-x}$, wherein the element M is Se or Te, and $0 \le x \le 1$), a Cu-based semiconductor material ($Cu_{2-y}Ag_ySe_{1-z}M_z$, wherein $0 \le y \le 1$, $0 \le z \le 1$, and the element M is S or Te), a Bi-Te-based semiconductor material, and a muddy mixture with a Bi-Te-based semiconductor material as a main component.

8. A batch preparation method for an interface layer of a semiconductor material leg array, comprising:

(1) selecting an organic binder as an inlay material and pouring the inlay material into the semiconductor material leg array prepared by the preparation method according to claim 1 to achieve an integral inlay of the organic binder, and after the inlay material is solidified, subjecting an end surface of the semiconductor material leg array to be flattened by physical treatment and/or chemical treatment, to obtain a semiconductor material leg array containing the inlay material; and (2) depositing the interface layer on the surface of the semiconductor material leg array containing the inlay material, and then removing the inlay material and the interface layer attached to the surface of the inlay material, thereby achieving the batch preparation of the interface layer of the semiconductor material leg array.

9. The batch preparation method for an interface layer of a semiconductor material leg array according to claim 8, wherein the inlay material is selected from one of photoresist, polydimethylsiloxane (PDMS), AB glue, cold and/or hot inlay material, and ethyl cyanoacrylate;

wherein the physical treatment and/or chemical treatment is at least one of mechanical polishing, chemical grinding, chemical etching, and chemical corrosion;

wherein the batch preparation method further comprises, after subjecting an end surface of the semiconductor material leg array to be flattened and before depositing the interface layer, adjusting the morphology of the end surface of the semiconductor material leg array; and wherein the morphology of the end surface is adjusted through sandblasting, chemical corrosion, or chemical etching to increase a roughness of the end surface.

10. The batch preparation method for an interface layer of a semiconductor material leg array according to claim 8, wherein the interface layer is selected from at least one of Cu, Ni, Al, In, Te, Sb, Bi, Ge, Pb, Ga, Zn, Cd, Pd, Pt, V, Ta, Hf, Fe, Co, Mn, Ru, Rh, Ir, Mo, Nb, W, Ti, Cr, Zr, Sn, Ag, Au, Pt, TiN, doped $ZrO_2$, $ThO_2$, $LaCrO_2$, $LaNiO_2$, $LaMnO_3$(sr), $CoCrO_4$, $LaCoO_3$(sr), $InO_2/SnO_2$, SiC, and $MoSi_2$;

wherein the interface layer has a number of layers of greater than or equal to 1;

wherein the interface layer has a thickness of 10 nm to 20 μm; and wherein the inlay material and the interface layer attached to the inlay material are removed by at least one of heating, illumination, chemical dissolution, and ultrasonic treatment.

* * * * *